United States Patent
McBride et al.

(10) Patent No.: US 8,570,657 B2
(45) Date of Patent: Oct. 29, 2013

(54) FAST-AXIS COLLIMATOR ARRAY

(75) Inventors: Roy McBride, Lochgelly (GB); Matthew Oren Currie, Edinburgh (GB); Jozef Jacek Wendland, Dalgety Bay (GB)

(73) Assignee: Power Photonic, Ltd. (GB)

( * ) Notice: Subject to any disclaimer, the term of this patent is extended or adjusted under 35 U.S.C. 154(b) by 70 days.

(21) Appl. No.: 13/291,974

(22) Filed: Nov. 8, 2011

(65) Prior Publication Data

US 2012/0140334 A1   Jun. 7, 2012

(30) Foreign Application Priority Data

Nov. 9, 2010   (GB) .................................... 1018914.0

(51) Int. Cl.
*G02B 27/30* (2006.01)
*G02B 3/00* (2006.01)

(52) U.S. Cl.
USPC .......................................... 359/641; 359/642

(58) Field of Classification Search
USPC .................. 359/619, 641, 642; 372/36–75
See application file for complete search history.

(56) References Cited

U.S. PATENT DOCUMENTS

| | | | |
|---|---|---|---|
| 5,861,992 A | 1/1999 | Gelbart | |
| 6,175,452 B1 | 1/2001 | Ullmann et al. | |
| 6,407,870 B1 | 6/2002 | Hurevich et al. | |
| 6,628,692 B2 * | 9/2003 | Kasamatsu | 372/70 |
| 6,771,686 B1 | 8/2004 | Ullman et al. | |
| 6,993,059 B2 | 1/2006 | Anikitchev et al. | |
| 7,317,470 B2 * | 1/2008 | Seibert | 347/244 |
| 2003/0063391 A1 | 4/2003 | Wang et al. | |
| 2006/0159147 A1 | 7/2006 | Grenier et al. | |
| 2008/0210671 A1 | 9/2008 | Jennings et al. | |

OTHER PUBLICATIONS

McBride, Roy; Baker, Howard, et al; "A High-Brightness QCW Pump Source Using a Pre-Aligned GRIN Lens"; Jan. 21, 2008; Proc. SPIE 6876, 687602; High Power Diode Laser Tech . . . .

Deng, Qiling et al; "Microlens Array for Stacked Laser Diode Beam Collimation"; 2005; Proc. SPIE vol. 5636; Holography, Diffractive Optics, and Applications II (ed. Y. Sheng).

* cited by examiner

*Primary Examiner* — Mohammed Hasan

(74) *Attorney, Agent, or Firm* — Law Office of Jesse D. Lambert, LLC

(57) ABSTRACT

A micro-optical element for use with an edge-emitting laser diode bar stack, the element comprising a plurality of spaced apart fast-axis collimators formed as a monolithic array, wherein the spacing between the collimators in the fast-axis varies across the micro-optic element. A method of manufacturing a micro-optical element for use with a laser diode bar stack, using a wavelength stabilized $CO_2$ laser is also described.

19 Claims, 3 Drawing Sheets

FAST-AXIS COLLIMATOR ARRAY

BACKGROUND TO INVENTION

The present invention relates to micro-optical elements for high power diode lasers and in particular, though not exclusively, to a monolithic fast-axis collimator array.

High power diode lasers are used in applications such as pumping of solid state lasers and directly in materials processing. In order to achieve the required power levels in a compact package, diode bars of emitters are arranged in stacks providing a two-dimensional array of emitters. The diode bars are typically a 10 mm long semiconductor bar fabricated with 19 to 79 emitters having widths of 100 to 200 µm. Fill factors typically range from 10% to 80% as a result of different combinations of emitter width and emitter pitch. For CW stacks the bar pitch is in the range 1 to 2 mm, while for QCW stacks pitch can be smaller, in the range 300 µm to 2 mm. The semiconductor is solder-bonded to a heat sink which can include channels for water cooling. A common configuration of commercially produced units stacks ten bars, each bar emitting 50-100 W, to build up a total laser power of 500-1000 W. Power levels up to 500 W per bar are achievable on QCW systems.

While such an arrangement produces high power, the beam quality is unacceptable for many applications. For high-brightness applications and also for some medium-brightness applications, by which we mean those with divergence well below the ex-facet divergence, the beam must be, at least, collimated. Manufacturers typically attach an individual fast-axis collimator to each bar. The most common fast-axis collimators are plano-acylindrical lenses, which are used to provide low aberration collimation for the high numerical aperture fast-axis beam, and cylindrical rod lenses, which provide poorer quality collimation at lower cost. The fast-axis refers to the vertical axis (perpendicular to the semiconductor wafer) where the beam diverges quickly (NA~0.5) from an emitter region in the µm range. This is in contrast to the slow-axis, parallel to the face of the bars, where the emitter region is more typically 100 µm (NA 0.05-0.1). The slow axis (x-axis) and the fast axis (y-axis) are perpendicular to each other and orthogonal to the propagation direction of the beam (z-axis).

For many applications, the resultant beam quality is still insufficient. The disadvantages in using a plano-acylindrical lens along each bar are apparent as: the collimation lens cannot be correctly positioned for all points along the bar as a result of the "smile" effect, where the semiconductor bar is bent in the fast-axis direction by differential expansion during solder bonding, resulting in beams with variable pointing direction; the "facet bending effect", where the semiconductor bar is bent in the direction of propagation again by the mechanical of the solder bonding process, resulting in beams with varying residual focal power, and errors in attaching the fast-axis collimator to the heat sink with the required positional accuracy also degrade the angular spectrum of the emitted light. Further, surface form errors in the acylindrical lens introduce aberrations that manifest themselves as wavefront distortion in the near field (i.e. the collimated wavefront is not perfectly flat) and divergence increase, leading to radiance loss, in the far-field. Additionally, in many applications of the laser diode stacks, subsequent aperture filling, beam shaping and beam combining optics are required and, due to errors in ray angles from the fast-axis collimator, the design and effectiveness of subsequent beam conditioning optics is compromised.

When the fast-axis bar pitch is smaller than ~1.2 mm, aligning and fitting individual collimation lenses becomes mechanically difficult, due to the small amount of space available for holding, adjusting, and fixing down each lens. When bar pitch is higher than ~1.2 mm, the same problems arise when high fill-factor collimation is required, since this requires the collimation lenses to be placed close together. Interleaving has been proposed (U.S. Pat. No. 6,993,059, U.S. Pat. No. 7,006,549, U.S. Pat. No. 6,266,359, U.S. Pat. No. 7,680,170) to achieve a fast-axis collimated beam with high fill-factor. Interleaving combines two low fill-factor beams using an interleaver optical element. The main disadvantage with this solution is that the interleaver element is expensive to manufacture and takes up a significant amount of space. Additionally most interleaver arrangements require two separate laser diode bar stacks. An alternative solution is to compact a single low fill-factor beam with a step mirror or alternative optic with a similar function. Such a mirror is described in U.S. Pat. No. 6,240,116. This solution has similar disadvantages to those of the interleaver element.

In an attempt to overcome some of these problems, Doric Lenses Inc., Quebec, Canada, have developed a fast-axis collimator lens array assembly using discrete fast-axis collimators located in a holder at the end of the diode bars. The pattern of emitters in the laser diode bar stack is measured and a unique lens holder is fabricated. Individual gradient-index cylindrical fast-axis collimator lenses are then located in the holder, with one lens per diode bar. In this way, the dominant irregularities in the geometry of the laser diode stack are replicated within the fast-axis array, and consequently, the mismatch between the stack and lens array is significantly reduced. This approach can therefore be used for high fill-factor collimation and can be used on arrays with small (<1.2 mm) fast-axis pitch.

There are, however, significant disadvantages in this approach. For large stacks, fitting these discrete collimators into the array is a time-consuming task, and typically this is done either manually or using a semi-automated system that still requires human input. The collimators must also be fixed in position, usually by epoxy, and thus a curing time is introduced which slows construction. Consequently, the cost of assembly and reliability in terms of ruggedness and environmental stability is undesirable. A further disadvantage is that the lens holder is populated with standard collimators i.e. fixed focal length and pitch, which limits the optimum beam correction. Further, this approach can only correct errors in fast-axis and slow-axis emitter position that vary linearly along each bar, and so it cannot correct for smile or facet bending.

SUMMARY OF INVENTION

It is an object of the present invention to provide a fast-axis collimator array which alleviates or mitigates at least some of the disadvantages of the prior art.

It is a further object of the present invention to provide a fast-axis collimator array whose properties are tailored to the geometry of a laser diode bar stack.

It is a still further object of the present invention to provide a monolithic array of fast-axis collimators for use with a laser diode bar stack.

It is a yet further object of at least one embodiment of the present invention to provide a method of manufacturing a monolithic array of fast-axis collimators for use with a laser diode bar stack.

According to a first aspect of the present invention there is provided a micro-optical element for use with an edge-emitting laser diode bar stack, the element comprising a plurality of fast-axis collimators formed as a monolithic array, wherein the spacing between the collimators in the fast-axis varies across the micro-optic element.

In this way, the array dimensions are matched to the number of emitters and a manufacturer needs only to mount a single optical element at the end of the laser diode bars, consequently reducing the potential for misalignment while increasing the speed of construction. As the dimensions of the element in the slow-axis and fast-axis directions are approximately 1 cm×1 cm, the element is also easier to handle than multiple discrete lenses. More particularly, the micro-optical element will provide better collimation than an array of collimators with equal spacing in the fast axis.

Preferably, the array is two-dimensional. Alternatively, the array is one-dimensional. Thus elements can be prepared for any number of diode bars in a stack.

Preferably, each fast-axis collimator comprises a lens form in the element. With each lens form describing a lens shape, an array of lenses is formed in the monolithic structure. Each lens form matches an emitter in the laser diode bar stack and thus the element can replace the holder and individual lenses in the prior art assembly of Doric.

Preferably, a depth of the lens shape is in the range 50 µm to 500 µm. Preferably also, a surface of the element is smoothed and polished. In this way, a precision micro-optical element is formed.

The plurality of fast-axis collimators may have substantially the same characteristics and be located in a substantially regular array. This provides an array of identical fast-axis collimators on a fixed pitch between each array on the x-axis. In this way, elements can be manufactured on a specific fixed pitch that is based on the actual mean pitch of a specific diode bar stack for each array on the x-axis.

Alternatively, fixed-pitch elements can be manufactured in a range of different pitches covering the typical process tolerance of bar pitch, and may be used on a production line as select-on-test components.

Using the technique of moving lithography, the focal length of each fast-axis collimator lens may be chosen to optimise the overall collimation for the bar that it collimates.

The above approaches do not deal with the problems of variable pitch between bars, variable bar-bar pitch along each bar, bar twist about the y-axis (fast-axis), bar smile, and other departures from the ideal geometry. Preferably, each fast-axis collimator has characteristics determined by a corresponding individual emitter location in a measured laser diode bar stack. In this way, the position and focal length of the fast-axis collimator array is designed to match the precise locations, and in particular the locations in the x, y and even z axes, of the emitters in the laser diode bar stack, giving improved beam quality as the fast-axis collimators are ideally matched to each emitter.

The lens shape may be interpolated along the slow-axis to give a continuous transition between lens forms. This is particularly suited for high fill factors, where the beams from adjacent emitters may overlap before reaching the exit surface of the lens. This interpolation advantageously avoids sudden discontinuities in surface height or slope or curvature, so that the lens forms can be located closer together and the element positioned closer to the laser diode bar stack i.e. providing a higher fill factor and finer pitch.

Preferably, the element includes further optical characteristics such as bow-tie correction or slow-axis collimation. Additionally, each collimator on the fast-axis can be modified to one producing a fast-axis flat-top function in the far-field of each emitter. By making lens shapes upon the monolithic element, any lens-based optical characteristic can be provided in the element.

Preferably the monolithic element is made of fused silica. This advantageously allows the use of laser micro-machining to give rapid fabrication times.

According to a second aspect of the present invention there is provided a method of manufacturing a micro-optical element for use with a laser diode bar stack, comprising the steps:
(a) providing a wavelength stabilized $CO_2$ laser with stable laser power operating on a laser line selected from the $CO_2$ spectrum;
(b) providing a computer controlled acousto-optic modulator to give temporal control on laser pulses from the $CO_2$ laser;
(c) providing a computer controlled X-Y translation stage;
(d) locating a monolithic substrate on the translation stage;
(e) operating the laser, acousto-optic modulator and the translation stage to ablate portions of the substrate in a shot-by-shot raster scan regime and form an array of predetermined lens forms on the substrate.

In this way, a micro-optical element is produced which avoids the tooling or mask writing steps of alternative techniques and provides for faster fabrication.

Preferably, the substrate is fused silica. It has been realised that such a material is advantageous for laser micro-machining.

Preferably, the method includes the additional step of operating a laser, acousto-optic modulator and the translation stage to melt the silica in a raster scan regime to laser micro-polish the surface of the micro-optical element.

By melting the surface of the silica in zones greater than the raster pitch, the residual pattern of the raster is removed and a smooth, polished surface is achieved. This step can also be achieved rapidly and provides a higher standard of smoothing than the mechanical polishing techniques used in conventional optical fabrication and on high-index glasses in particular.

Preferably, the method includes the step of analysing the emitter geometries of the laser diode bar stack to determine shapes for the lens forms required. In this way, a tailored monolithic fast-axis collimator array is realised.

BRIEF DESCRIPTION OF THE DRAWING(S)

Embodiments of the present invention will now be described, by way of example only, with reference to the accompanying drawings of which:

DETAILED DESCRIPTION OF THE PREFERRED EMBODIMENT(S)

Figure 2:
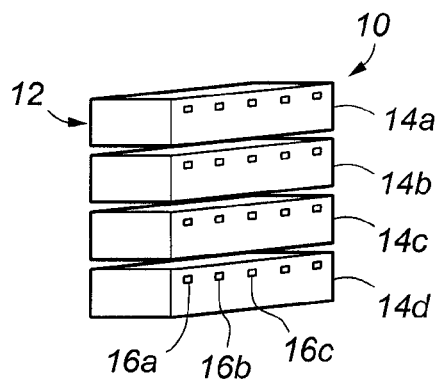
FIG. 2 is a schematic illustration of a high power laser diode bar stack.

Referring initially to FIG. 2 of the drawings there is illustrated an end of a high power diode laser, generally indicated by reference numeral 10. The end shows a laser diode bar stack 12 comprising four bars 14a-d of emitters 16a-e. This is a simplified stack as the range of values is indicated hereinbefore. The pitch between emitters 16 and the bars 14 is deliberately small so that a high fill-factor exists to provide the required high power density.

Figure 3:
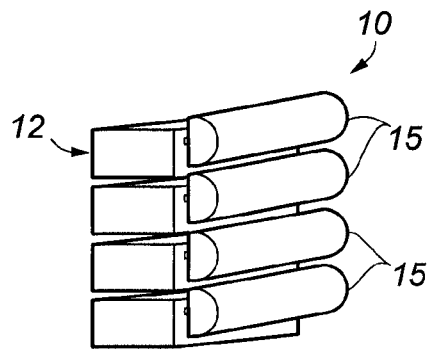
FIG. 3 is a schematic illustration of a set of plano acylindrical lenses located in front of the diode bar stack of FIG. 2 according to the prior art.

As discussed previously, the bar stacks 12 produce beams of high divergence in the fast axis (y-z plane). Collimation of each beam on the fast axis is required to provide a useful output from the stack 12. A prior art system is illustrated in FIG. 3. Here four identical plano-acylindrical lenses 15 are positioned in fixed orientation close to the end 12 and aligned with each bar 14. These fast-axis collimators 15 provide low aberration collimation for the high numerical aperture fast-axis beam. The disadvantages of this approach are discussed hereinbefore.

Figure 1:
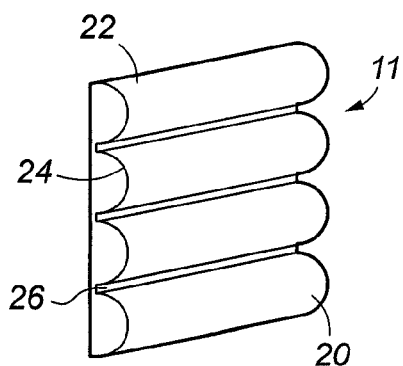
FIG. 1 is a schematic illustration of a micro-optical element for a high power diode laser according to a first embodiment of the present invention.

Referring now to FIG. 1 of the drawings there is illustrated a micro-optical element, generally indicated by reference numeral 11, to be positioned at an end of a laser diode bar stack 12 of a high power diode laser 10, according to an embodiment of the present invention.

Element 11 is a monolithic structure of fused silica with dimensions of approximately 1 cm². One face is machined flat, while machined on the opposing front-face 20 is a two dimensional array of lens forms 22. The number and location of each lens form 22 matches the emitters 16 of the bar stack 12. Each lens form 22 defines a lens shape 24, being primarily convex with a depth (in the propagation axis z) of between 50 μm and 500 μm. The lens shape defines a fast-axis collimator as is known in the art. While one side is shown as a flat face, the present invention allows for both sides of the element to be formed into lens forms 22.

The lens shapes 22 match those of the individual lenses 15 of the prior art, but are now formed together on a single structure. A continuous surface 26 is provided between the lenses on the fast-axis. Surface 26 is formed as a trough of sufficient depth to define the four separate lens shapes 22.

The lens shape 22 is defined from the bar pitch and the fast-axis numerical aperture of the emitters 16. In the first embodiment of the present invention, the lens shapes are uniform across the array and assume a variable pitch. In constructing a high power diode laser, a manufacturer could choose such a uniform array of fast-axis collimators from a set manufactured in a range of different pitches covering the typical process tolerance of bar pitch. These would be select-on-test components.

This will typically achieve fast-axis divergence of 1 degree to 6 degrees, depending on the pitch increment of the fast-axis collimator arrays provided and various other mechanical and optical factors.

Figure 4:
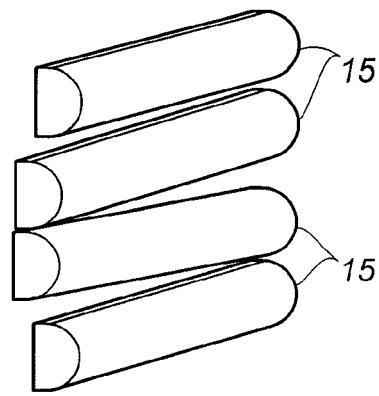
FIG. 4 is the set of plano acylindrical lenses of FIG. 3 shown in calculated geometrical orientations.

However, it is known that due to manufacture and construction tolerances in the diode bar stack 12, a planar face of perfectly orientated emitters 16 is not typical. Each bar 14 will have a unique geometrical orientation. Such an orientation can be measured, by techniques known to those skilled in the art. The location of the fast-axis collimators 15 with respect to the diode stack can therefore be calculated and FIG. 4 shows an exaggerated required orientation. In order to mount the four individual lenses 15 in these orientations would require a specially designed lens holder together with skilled mounting, gluing and curing procedures. This is exceptionally time intensive and consequently expensive.

Figure 5:
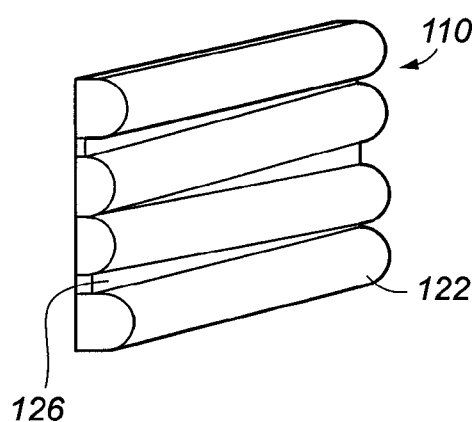
FIG. 5 is a micro-optical element for a high power diode laser according to a second embodiment of the present invention.

Taking the measurements of the orientations of the bar stacks 12, a single monolithic two dimensional array of fast-axis collimators can be formed. This optical element 110 is illustrated in FIG. 5. Each lens shape 122 provides a fast-axis collimator in relation to each bar 14. Surface 126, is a trough of variable width to accommodate the orientations of the lens shapes 22. The resulting element 110 is a fast-axis collimator array of typical dimensions, 10 mm×10 mm. Thus the element 110 is easier to handle and individual positioning of lenses or the manufacture of a specially designed lens holder is not required.

Figure 6:
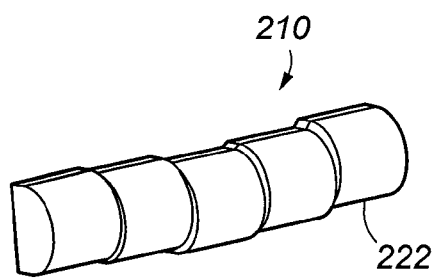
FIG. 6 is a micro-optical element for a high power diode laser according to a third embodiment of the present invention.

In a preferred embodiment of the present invention, the emitter geometries from a chosen bar stack 12 will be measured, providing separate values for to the location of each emitter 16. Each lens shape 22 on the element 10 is then machined to match the location of the corresponding emitter 16 in terms of back focal length and optical axis. FIG. 6 illustrates a 1D array 210, showing lens shapes 222 for a single bar 14, which are matched in this way. Distinguishable lens shapes 222 are now apparent along the slow axis (y-z plane). Troughs between the lens shapes 222 are deliberately interpolated along the slow axis to give a continuous transition between lens forms to avoid sudden discontinuities in surface height or slope or curvature.

Figure 7:
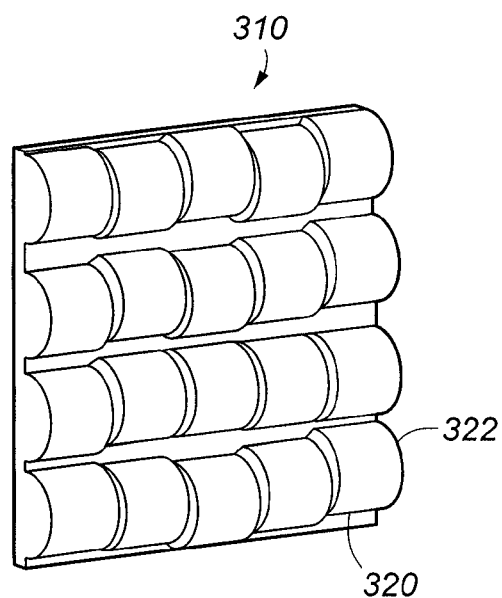
FIG. 7 is a micro-optical element for a high power diode laser according to a fourth embodiment of the present invention.

While FIG. 6 illustrates a one dimensional array, reference is now made to FIG. 7 of the drawings which illustrates a micro-optical element 310, having a two dimensional array of fast-axis collimators, according to a further embodiment of the present invention. In this element 322, the individual calculations from each emitter 16 are used to provide lens shapes 322 over the surface 320 to provide a highly collimated output beam to the laser diode stack 12. The troughs in spaces 326 are all smoothed allowing both definition to the lenses 322 while removing sudden discontinuities. The resulting element 310 is again, a fast-axis collimator array of typical dimensions, 10 mm×10 mm. Thus the element 310 is easier to handle and individual positioning of lenses or the manufacture of a specially designed lens holder is not required.

Other dimensions may be calculated to provide further properties to the element 310. For example, collimation may be achieved across the slow-axis. Corrective measures may also be incorporated such as bow-tie correction as is known in the art. Beam shaping properties may also be incorporated such as producing a fast-axis flat-top function in the far-field of each emitter.

Figure 8:
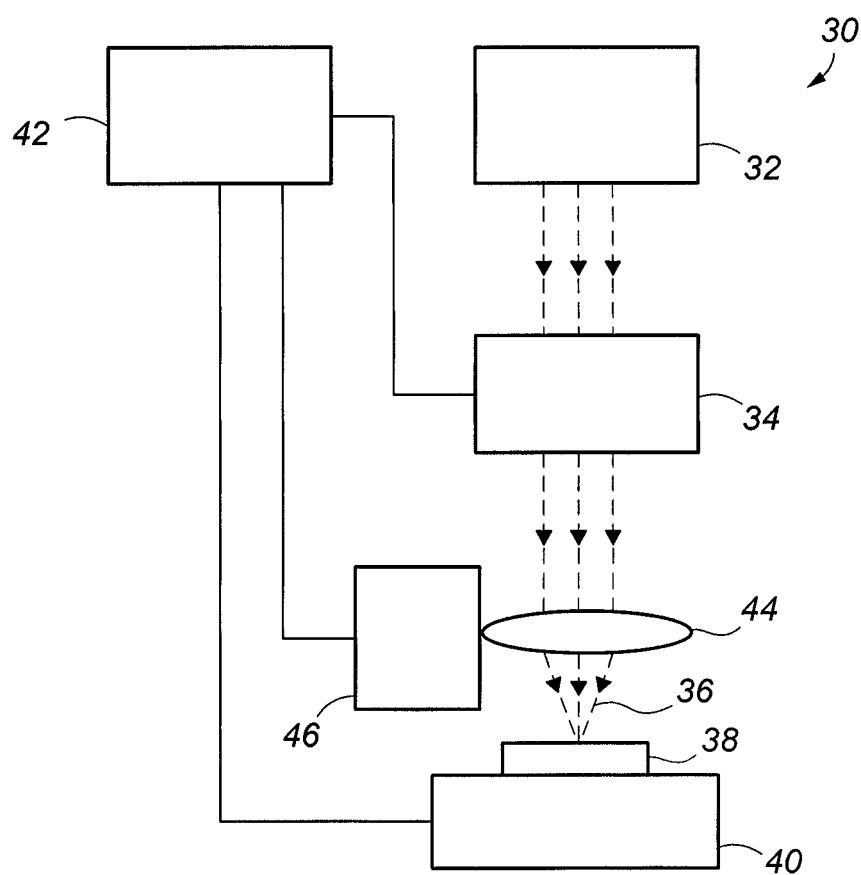
FIG. 8 is a schematic illustration of components and steps in a method of manufacturing a micro-optical element for use with high power diode laser according to an embodiment of the present invention.

Reference is now made to FIG. 8 of the drawings which illustrates the components of a laser micro-machining process, generally indicated by reference numeral 30, for creating a micro-optical element 11,110,210,310 for use with a laser diode bar stack 12. An RF excited $CO_2$ laser 32 is arranged before an acousto-optic modulator (AOM) 34. Various optical elements (not shown) direct the output beam 36 to a silica substrate 38 upon which the lens shapes 22 will be machined.

The fused silica substrate 38 (typically a piece of flat, parallel-sided fused silica 1 mm thick) is mounted upon an XY translation stage 40, which is computer 42 controlled to move in steps of 100 nm in the two dimensions. A focussing lens 44 mounted on a computer controlled Z stage 46, focuses the beam 36 onto the substrate, a required depth to ablate the silica. The computer 42 moves the stages 40,46 in a raster configuration so that controlled ablation, by shot-by-shot laser writing, of the silica 38 is achieved to create the required lens shapes 22 to form the array of fast-axis collimators.

Typically the spot on the substrate 38 corresponds to a Gaussian beam waist such that the spot profile at the surface to be machined is circular Gaussian. The beam radius may be on the order of approximately 25 μm.

The time needed to machine each lens shape 22 is approximately 10 minutes. The entire element 11 can thus be manufactured in a relative short amount of time providing the ability to undertake rapid prototyping.

The as-machined surface 20 of the element 11 is then subjected to a raster scan of the laser beam in a near CW operating regime. A melt zone of diameter approximately 200 μm is thus created which removes the residual pattern of the raster and smoothes or polishes the surface 20. This can be carried out by the same system, as described with reference to FIG. 8, as performs the smoothing, under a near-CW mode of operation, in which case the substrate 38 does not require to be moved between the machining and polishing steps. Alternatively, the process can be carried out by a separate system that is optimised for the laser smoothing process.

The principle advantage of the present invention is that it provides a monolithic fast-axis collimator array for use with a high power laser diode with stacked bars. Such a monolithic structure provides an optical element which can be used in lasers with a high fill-factor, where individual optics would be too large.

A monolithic micro-optical element provides advantages in reducing the manual skill requirement on production, increases the speed of fabricating element, reduces the costs to manufacture, reduces the requirement for epoxy and consequently reduces the cure time, and improves stability of overall laser construction.

A yet further advantage of the present invention is that it provides a monolithic micro-optical element by laser micro-machining. This approach to fabrication avoids sharp grinding errors. Though it is generally assumed that silica would be a bad material to make a fast-axis collimator, the present invention shows that by combining laser micro-machining with melting to smooth the silica, high tolerance elements without sharp grinding errors are realised.

It will be appreciated by those skilled in the art that modifications may be made to invention herein described without departing from the scope thereof. For example, not all emitter positions need to be measured to provide a tailored element, and the exact form of the lens array may be varied in order to trade off optical performance against ease of fabrication and test or availability of measurement data. In the most general case, each lens element is precisely matched the location of the corresponding emitting in both back focal length and in the position of the optical axis in the fast-axis direction.

(a) The height of the optical axis of the lens form may vary linearly along each bar, in order to take account of relative bar twist about the z-axis but not bar smile;

(b) The height of the optical axis of the lens form may follow a parabolic path along each bar, in order to correct relative bar twist and smile, but not higher order deformations;

(c) The lens form may be constant along the slow axis, but the lens thickness varied to vary back focal length;

(d) The back focal length or the thickness of the lens form may vary linearly along each bar, in order to take account of bar twist about the y-axis, but not facet bending;

(e) The back focal length or the thickness of the lens form may vary quadratically along each bar, in order to take account of the main deformation due to facet bending.

For manufacture and test, it is advantageous to use a modification in which the lens profile remains constant along the lens. It is particularly advantageous if the either optical axis or the lens thickness or both vary linearly along the lens.

Additional optical elements such as phase plates can be used in conjunction with the fast-axis collimator array to further improve the beam quality.

We claim:

1. A micro-optical element for use with an edge-emitting laser diode bar stack, the element comprising a plurality of spaced apart fast-axis collimators formed as a monolithic array, wherein the plurality of fast-axis collimators each have characteristics determined by emitter locations in the measured laser diode bar stack and the spacing between the collimators in the fast-axis varies across the micro-optic element.

2. A micro-optical element according to claim 1 wherein the array is two-dimensional.

3. A micro-optical element according to claim 1 wherein the array is one-dimensional.

4. A micro-optical element according to claim 1 wherein each fast-axis collimator comprises a lens form in the element.

5. A micro-optical element according to claim 4 wherein each lens form describes a lens shape.

6. A micro-optical element according to claim 5 wherein a depth of the lens shape is in the range 50 μm to 500 μm.

7. A micro-optical element according to claim 6 wherein a surface of the element is smoothed and polished.

8. A micro-optical element according to claim 4 wherein each lens form matches an emitter in a laser diode bar stack.

9. A micro-optical element according to claim 4 wherein the lens shape is interpolated along the slow-axis to give a continuous transition between lens forms.

10. A micro-optical element according to claim 1 wherein the element includes optical characteristics of bow-tie correction.

11. A micro-optical element according to claim 1 wherein the element includes optical characteristics of slow-axis collimation.

12. A micro-optical element according to claim 1 wherein each collimator on the fast-axis is modified to one producing a predetermined function in the far-field of each emitter.

13. A micro-optical element according to claim 12 wherein each collimator on the fast-axis is modified to one producing a fast-axis flat-top function in the far-field of each emitter.

14. A micro-optical element according to claim 1 wherein the monolithic element is made of fused silica.

15. A method of manufacturing a micro-optical element for use with a laser diode bar stack, comprising the steps:

(a) providing a wavelength stabilized $CO_2$ laser with stable laser power operating on a laser line selected from the $CO_2$ spectrum;

(b) providing a computer controlled acousto-optic modulator to give temporal control on laser pulses from the $CO_2$ laser;

(c) providing a computer controlled X-Y translation stage;

(d) locating a monolithic substrate on the translation stage; and (e) operating the laser, acousto-optic modulator and the translation stage to ablate portions of the substrate in a shot-by-shot raster scan regime and form an array of predetermined lens forms on the substrate.

16. A method of manufacturing a micro-optical element according to claim 15 wherein the substrate is fused silica.

17. A method of manufacturing a micro-optical element according to claim 15 wherein the method includes the additional step of operating the laser, acousto-optic modulator and the translation stage to melt the silica in a continuous wave (CW) scan regime to laser micro-polish the surface of the micro-optical element.

18. A method of manufacturing a micro-optical element according to claim 15 wherein the method includes the additional step of operating the laser, acousto-optic modulator and the translation stage to melt the silica in a shot-by-shot raster scan regime to laser micro-polish the surface of the micro-optical element.

19. A method of manufacturing a micro-optical element according to claim 15 wherein the method includes the step of analysing the emitter geometries of the laser diode bar stack to determine shapes for the lens forms required.

\* \* \* \* \*